United States Patent
Chiang et al.

(10) Patent No.: US 11,075,201 B2
(45) Date of Patent: *Jul. 27, 2021

(54) TUNING TENSILE STRAIN ON FINFET

(71) Applicant: Taiwan Semiconductor Manufacturing Company, Ltd., Hsinchu (TW)

(72) Inventors: Kuo-Cheng Chiang, Zhubei (TW); Zhi-Chang Lin, Zhubei (TW); Guan-Lin Chen, Baoshan Township (TW); Ting-Hung Hsu, MiaoLi (TW); Jiun-Jia Huang, Beigang Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/569,843

(22) Filed: Sep. 13, 2019

(65) Prior Publication Data

US 2020/0006344 A1 Jan. 2, 2020

Related U.S. Application Data

(62) Division of application No. 15/482,167, filed on Apr. 7, 2017, now Pat. No. 10,453,842, which is a division
(Continued)

(51) Int. Cl.
*H01L 21/8234* (2006.01)
*H01L 21/8238* (2006.01)
(Continued)

(52) U.S. Cl.
CPC .... *H01L 27/0924* (2013.01); *H01L 21/02356* (2013.01); *H01L 21/82385* (2013.01);
(Continued)

(58) Field of Classification Search
CPC ....... H01L 21/02356; H01L 21/823821; H01L 21/82385; H01L 21/823864;
(Continued)

(56) References Cited

U.S. PATENT DOCUMENTS

| 5,153,145 A | 10/1992 | Lee et al. |
| 5,517,045 A | 5/1996 | Ho et al. |

(Continued)

FOREIGN PATENT DOCUMENTS

| CN | 1694231 A | 11/2005 |
| JP | 2003224264 A | 8/2003 |

OTHER PUBLICATIONS

Serra, N., et al., "Experimental and Physics-Based Modeling Assessment of Strain Induced Mobility Enhancement in FinFets," IEEE 2009, pp. 4.2.1-4.2.4.

*Primary Examiner* — Mary A Wilczewski
(74) *Attorney, Agent, or Firm* — Slater Matsil, LLP

(57) ABSTRACT

A fin field effect transistor (FinFET) having a tunable tensile strain and an embodiment method of tuning tensile strain in an integrated circuit are provided. The method includes forming a source/drain region on opposing sides of a gate region in a fin, forming spacers over the fin, the spacers adjacent to the source/drain regions, depositing a dielectric between the spacers; and performing an annealing process to contract the dielectric, the dielectric contraction deforming the spacers, the spacer deformation enlarging the gate region in the fin.

20 Claims, 11 Drawing Sheets

Related U.S. Application Data of application No. 14/839,560, filed on Aug. 28, 2015, now Pat. No. 9,627,385, which is a division of application No. 13/901,399, filed on May 23, 2013, now Pat. No. 9,153,668.

(51) Int. Cl.

| | | |
|---|---|---|
| *H01L 27/088* | (2006.01) | |
| *H01L 27/092* | (2006.01) | |
| *H01L 29/06* | (2006.01) | |
| *H01L 29/417* | (2006.01) | |
| *H01L 29/423* | (2006.01) | |
| *H01L 29/78* | (2006.01) | |
| *H01L 29/66* | (2006.01) | |
| *H01L 21/02* | (2006.01) | |

(52) U.S. Cl.
CPC .......... *H01L 21/823821* (2013.01); *H01L 21/823864* (2013.01); *H01L 27/0922* (2013.01); *H01L 29/0649* (2013.01); *H01L 29/41791* (2013.01); *H01L 29/66795* (2013.01); *H01L 29/785* (2013.01); *H01L 29/7842* (2013.01); *H01L 29/7843* (2013.01); *H01L 29/7848* (2013.01)

(58) Field of Classification Search
CPC ............ H01L 27/0922; H01L 29/0924; H01L 29/0649; H01L 29/41791; H01L 29/66795; H01L 29/7842; H01L 29/7843; H01L 29/7848; H01L 29/785; H01L 21/823828; H01L 21/823431; H01L 21/823437; H01L 21/823456; H01L 21/823468; H01L 27/0924
See application file for complete search history.

(56) References Cited

U.S. PATENT DOCUMENTS

| | | | |
|---|---|---|---|
| 5,685,950 | A | 11/1997 | Sato |
| 5,840,611 | A | 11/1998 | Lee et al. |
| 5,858,867 | A | 1/1999 | Hsia et al. |
| 5,877,530 | A | 3/1999 | Aronowitz et al. |
| 5,879,975 | A | 3/1999 | Karlsson et al. |
| 6,060,375 | A | 5/2000 | Owyang et al. |
| 6,107,148 | A | 8/2000 | Taki |
| 6,143,611 | A | 11/2000 | Gilton et al. |
| 6,191,044 | B1 | 2/2001 | Yu et al. |
| 6,337,236 | B2 | 1/2002 | Yamazaki et al. |
| 6,433,871 | B1 | 8/2002 | Lensing et al. |
| 6,524,916 | B1 | 2/2003 | Scholer et al. |
| 6,674,137 | B2 | 1/2004 | Nissa |
| 6,699,755 | B1 | 3/2004 | Chiou et al. |
| 6,716,690 | B1 | 4/2004 | Wang et al. |
| 6,830,975 | B2 | 12/2004 | Bicksler et al. |
| 6,943,403 | B2 | 9/2005 | Park |
| 7,151,031 | B2 | 12/2006 | Kwon et al. |
| 7,208,361 | B2 | 4/2007 | Shah et al. |
| 7,235,469 | B2 | 6/2007 | Okayama et al. |
| 7,939,895 | B2 | 5/2011 | Fukasaku |
| 8,076,735 | B2 | 12/2011 | Lin |
| 8,288,262 | B2 * | 10/2012 | Lin ............... H01L 29/7833 438/587 |
| 8,384,162 | B2 | 2/2013 | Yin et al. |
| 9,153,668 | B2 | 10/2015 | Ching et al. |
| 9,627,385 | B2 | 4/2017 | Ching et al. |
| 9,899,382 | B2 | 2/2018 | Huang et al. |
| 9,917,165 | B2 * | 3/2018 | Wu ............... H01L 29/788 |
| 10,050,131 | B2 | 8/2018 | Wong et al. |
| 10,177,253 | B2 * | 1/2019 | Kim ............... H01L 29/66545 |
| 10,453,842 | B2 * | 10/2019 | Ching ............ H01L 21/82385 |
| 10,522,682 | B2 * | 12/2019 | Yoon .............. H01L 27/0886 |
| 2002/0003275 | A1 | 1/2002 | Lee et al. |
| 2002/0004282 | A1 | 1/2002 | Hong |
| 2002/0163036 | A1 | 11/2002 | Miura et al. |
| 2003/0143814 | A1 | 7/2003 | Bicksler et al. |
| 2004/0046206 | A1 | 3/2004 | Yun et al. |
| 2004/0119110 | A1 | 6/2004 | Park |
| 2004/0262697 | A1 | 12/2004 | Enders et al. |
| 2005/0242376 | A1 | 11/2005 | Chen et al. |
| 2005/0250283 | A1 | 11/2005 | Park |
| 2005/0280051 | A1 | 12/2005 | Chidambarrao et al. |
| 2006/0065893 | A1 | 3/2006 | Jin et al. |
| 2007/0001217 | A1 | 1/2007 | Chen et al. |
| 2007/0026578 | A1 | 2/2007 | Kim et al. |
| 2007/0126067 | A1 | 6/2007 | Hattendorf et al. |
| 2007/0224706 | A1 | 9/2007 | Izumi |
| 2009/0085122 | A1 | 4/2009 | Ho et al. |
| 2009/0218603 | A1 * | 9/2009 | Brask ............. H01L 21/30617 257/255 |
| 2009/0256191 | A1 | 10/2009 | White et al. |
| 2009/0289284 | A1 | 11/2009 | Goh et al. |
| 2011/0079854 | A1 * | 4/2011 | Lin ............... H01L 21/823807 257/365 |
| 2011/0147815 | A1 | 6/2011 | Takeda |
| 2012/0034747 | A1 | 2/2012 | Lin |
| 2012/0129312 | A1 | 5/2012 | Utonno et al. |
| 2012/0146154 | A1 | 6/2012 | Itou et al. |
| 2013/0007678 | A1 | 1/2013 | Yang et al. |
| 2013/0093026 | A1 | 4/2013 | Wann et al. |
| 2014/0061862 | A1 | 3/2014 | Vega et al. |
| 2014/0117425 | A1 | 5/2014 | Pradhan et al. |
| 2014/0231919 | A1 | 8/2014 | Peng et al. |
| 2014/0346607 | A1 | 11/2014 | Ching et al. |
| 2016/0056157 | A1 | 2/2016 | Ching et al. |
| 2016/0111531 | A1 | 4/2016 | Dong |
| 2017/0117192 | A1 | 4/2017 | Min et al. |
| 2017/0117363 | A1 | 4/2017 | Kim et al. |
| 2017/0170303 | A1 | 6/2017 | Wong et al. |
| 2017/0213820 | A1 | 7/2017 | Ching et al. |
| 2017/0222006 | A1 | 8/2017 | Suh et al. |
| 2017/0275554 | A1 | 9/2017 | Thalen |
| 2017/0345712 | A1 | 11/2017 | Min et al. |
| 2017/0258665 | A1 | 12/2017 | Song et al. |
| 2017/0352656 | A1 | 12/2017 | Huang et al. |
| 2017/0365604 | A1 | 12/2017 | Suh et al. |
| 2019/0043981 | A1 * | 2/2019 | Yoon .............. H01L 21/76834 |
| 2019/0139775 | A1 * | 5/2019 | Hsieh ............. H01L 21/32133 |
| 2020/0006344 | A1 * | 1/2020 | Chiang ........... H01L 21/82385 |
| 2020/0020593 | A1 * | 1/2020 | Lin ............... H01L 21/823828 |

\* cited by examiner

30

| | Compressive | | | Tensile | | |
|---|---|---|---|---|---|---|
| | $T_{fL}$ | $T_{fW}$ | $T_{fH}$ | $T_{fH}$ | $T_{fW}$ | $T_{fL}$ |
| Electron mobility | ↗ | ↗ | ↗ | ↘ | ↗ | ↘ |
| Hole mobility | ↗ | = | ↘ | ↗ | ↗ | ↘ |

FinFET stress components: $\begin{cases} T_{fH}\text{:fin-height} \\ T_{fW}\text{:fin-width} \\ T_{fL}\text{:source-drain} \end{cases}$ Table summarizing the impact of different stress components on the electron and hole $(110)/[1\bar{1}0]$ FinFETs mobility

Fig. 3

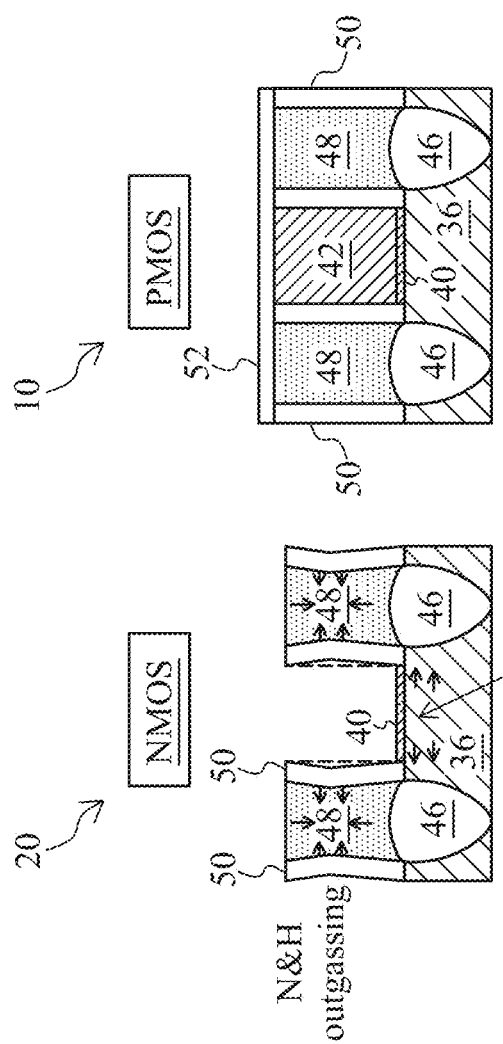
Fig. 9
Fig. 10
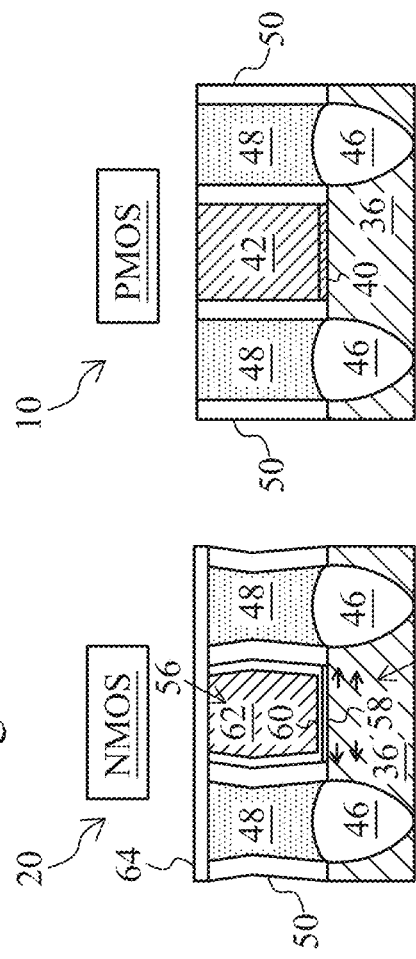
Fig. 11
Fig. 12

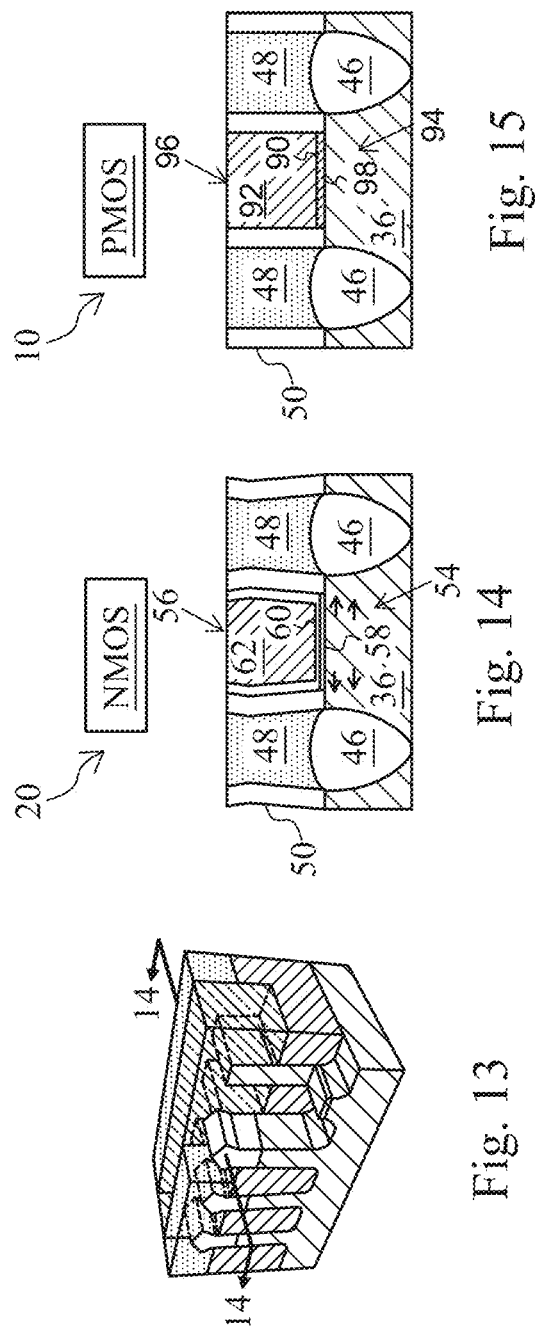

| Lot ID | Ctrl-1 | N stressor-1 | Ctrl-2 | N stressor-2 |
|---|---|---|---|---|
| Process | No extra ANL | 600C 2hr a/f PORM | No extra ANL | 600C 1hr a/f PORM |
| Lg(nm) | 30.4 | 34.3 | 31.9 | 33.6 |
| ΔLg(nm) | | +3.9 | | +1.7 |

Fig. 16

TUNING TENSILE STRAIN ON FINFET

This application is a divisional of U.S. patent application Ser. No. 15/482,167, now U.S. Pat. No. 10,453,842, issued Oct. 22, 2019, entitled "Tuning Tensile Stress on FinFET," filed on Apr. 7, 2017, which is a divisional of U.S. patent application Ser. No. 14/839,560, entitled "Tuning Tensile Stress on FinFET," filed on Aug. 28, 2015, now U.S. Pat. No. 9,627,385, issued Apr. 18, 2017, which is a divisional of U.S. patent application Ser. No. 13/901,399, entitled "Tuning Tensile Stress on FinFET," filed on May 23, 2013, now U.S. Pat. No. 9,153,668, issued Oct. 6, 2015, which applications are incorporated herein by reference in their entirety.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, fin FETs (FinFETs) or multiple gate transistors are used in sub 32 nm transistor nodes. FinFETs not only improve areal density, but also improve gate control of the channel.

In some cases, FinFETs have been constructed using a replacement gate process. During such process, the FinFET is initially provided with polysilicon gates, which are better able to withstand the more severe processing conditions of the immediately subsequent processing operations. Thereafter, in later stages of processing when processing conditions are less severe, the polysilicon gates are removed from the FinFET structures and replaced with permanent metal gates.

In recent years, attempts have been made to improve the performance or manipulate the characteristics of FinFETs with a stressor. Several methods of forming these stressors for FinFETs have been proposed or used in fabrication.

BRIEF DESCRIPTION OF THE DRAWINGS

For a more complete understanding of the present disclosure, and the advantages thereof, reference is now made to the following descriptions taken in conjunction with the accompanying drawing, in which:

FIG. 3 is a table summarizing the impact of different stress components on the electron and hole (110/[110]) FinFETs mobility;

FIGS. 4A, 4B, and 5-15 collectively illustrate a method of forming an embodiment n-type FinFET 20 with tunable tensile strain relative to the p-type FinFET;

FIG. 16 is a chart illustrating how subjecting the dielectric in the n-type FinFET to the annealing process (i.e., the thermal process) affects gate length of the transistor;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative, and do not limit the scope of the disclosure.

The present disclosure will be described with respect to embodiments in a specific context, namely a FinFET. The disclosure may also be applied, however, to other integrated circuits, electronic structures, and the like.

Figure 1:
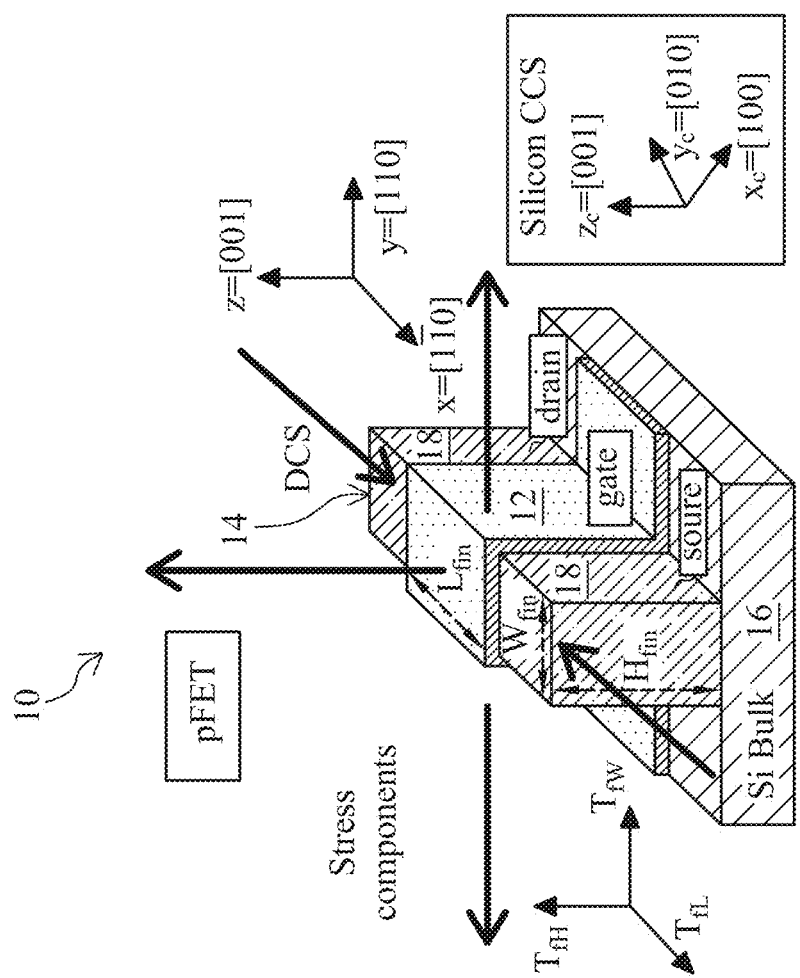
FIGS. 1-2 illustrate a p-type fin field-effect transistor (FinFET) and an n-type FinFET.

Referring now to FIG. 1, a p-type FinFET 10 is illustrated. As shown, the p-type FinFET 10 (a.k.a., pFET or PMOS) includes a gate 12 disposed over a fin 14 projecting above a silicon (Si) bulk substrate 16 or silicon-on-insulator (SOI) substrate (not shown). In addition, a source/drain 18 are found at opposing ends of the fin 14 outside the gate 12. In real production, an effective stressor is produced in the p-type FinFET 10 by forming the source/drain 18 using silicon germanium (SiGe).

Figure 2:
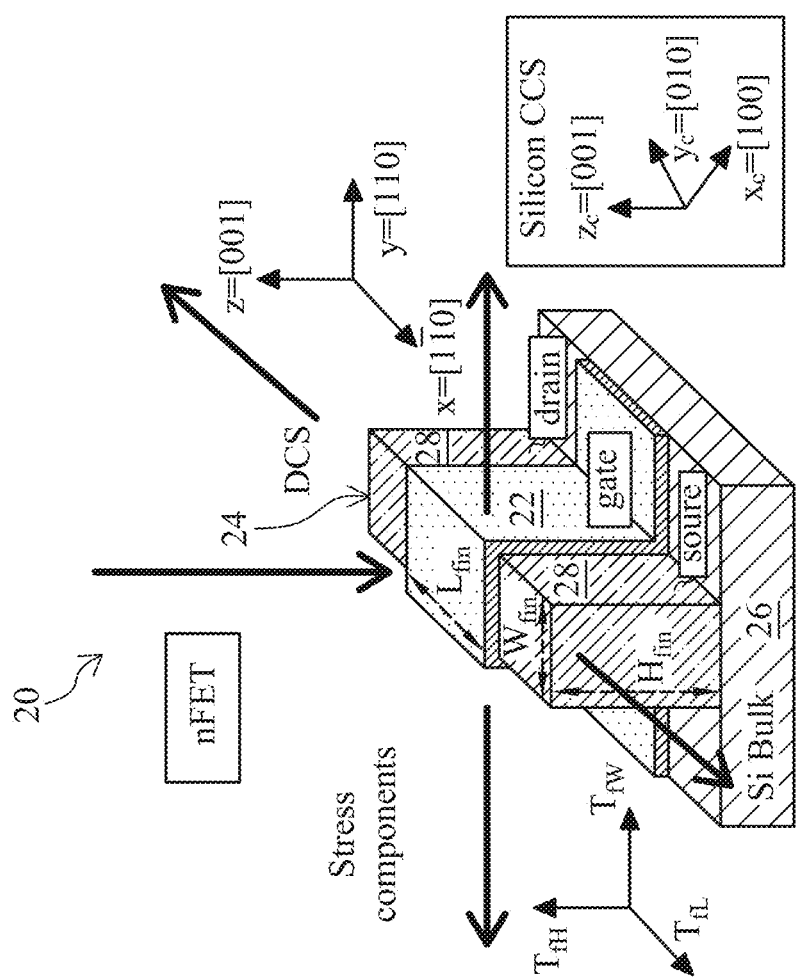

Referring now to FIG. 2, an n-type FinFET 20 is illustrated. As shown, the n-type FinFET 20 (a.k.a., nFET or NMOS) includes a gate 22 disposed over a fin 24 projecting above a silicon bulk substrate 26 or SOI substrate (not shown). In addition, a source/drain 28 are found at opposing ends of the fin 24 outside the gate 22. Unlike the p-type FinFET 10, an effective stressor is difficult to produce in the n-type FinFET 20 during real production.

Referring now to both FIGS. 1-2, the p-type FinFET 10 and the n-type FinFET 20 each define a fin height, $H_{fin}$, a fin width, $W_{fin}$, and a gate length, $L_{fin}$. Stress components for the fin height, $T_{fH}$, the fin width, $T_{fW}$, and the source-drain, $T_{fL}$, direction for the two transistors are shown in the device coordinate system (DCS). In addition, the silicon crystal coordinate system (CCS) for the two transistors is also depicted.

Referring now to FIG. 3, a table 30 summarizing the impact of different stress components on the electron and hole (110/[110]) FinFETs mobility is provided. As highlighted, the electron mobility increases and the hole mobility decreases when the tensile strain in increased in the source-drain, $T_{fL}$, direction. Therefore, an n-type FinFET 20 with a stressor configured to provide sufficient tensile strain in the source-drain, $T_{fL}$, direction would be beneficial.

Figure 4A:
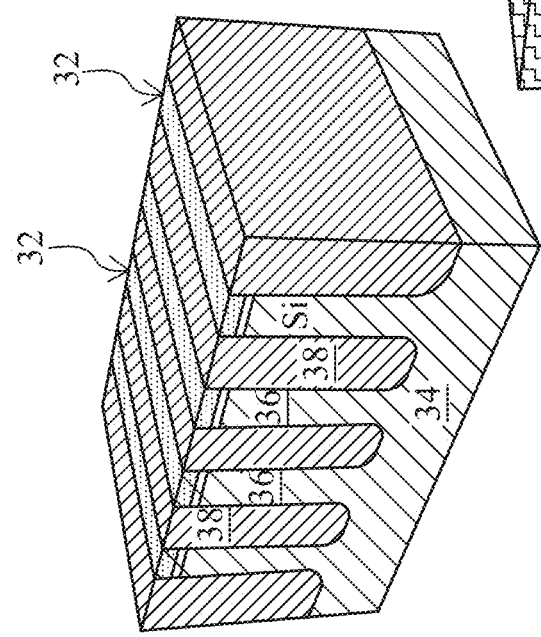
Figure 4B:
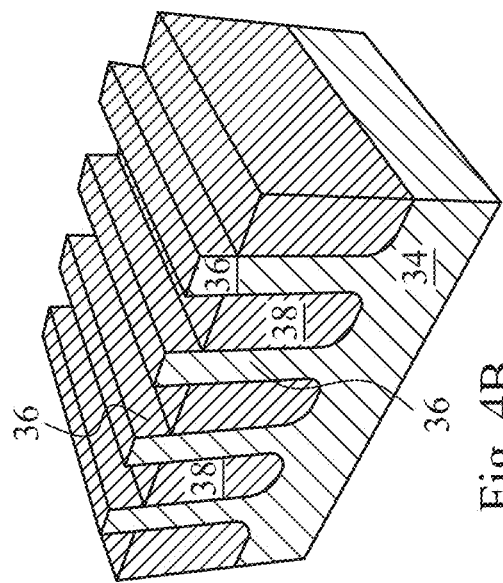

Referring collectively to FIGS. 4A, 4B, and 5-15, a method of forming an embodiment n-type FinFET 20 with tunable tensile strain is illustrated relative to the p-type FinFET 10. Referring now to FIGS. 4A and 4B, the method generally begins with fin patterning. In an embodiment, both the fins 36 and the substrate 34 are formed from silicon. However, the fins 36 and substrate 34 may be formed from a variety of suitable semiconductor materials, such as Ge, SiGe, or III-V material.

After the fins 36 have been formed, an oxide deposition process is performed to generate the shallow trench isolation (STI) regions 38 on opposing sides of the fins 36. Thereafter, a chemical-mechanical polishing (CMP) process is performed to smooth the top surface of the device. Next, the hard mask 32 shown in FIG. 4 is removed. In an embodiment, the hard mask 32 was formed from two layers, namely a nitride layer over an oxide layer.

Figure 5:
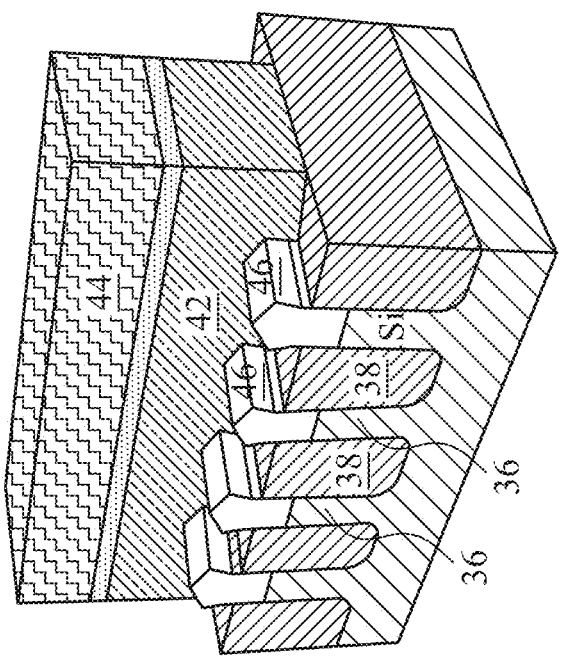

After the hard mask 32 has been removed, a well implantation and an annealing step are performed. Thereafter, a dummy gate oxide 40 (i.e., IO OX) (see FIG. 7) is deposited. Once the dummy gate oxide 40 has been deposited, a polysilicon layer 42 is deposited and patterned using a hard mask 44 as shown in FIG. 5. Next, a lightly doped drain (LDD) implantation process and an annealing process are performed.

Figure 7:
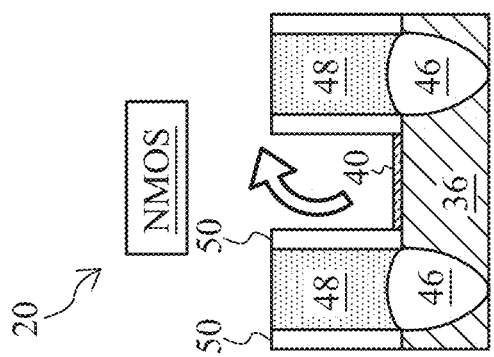

Still referring to FIG. 5, after the LDD implantation and annealing steps, source/drain recessing is performed to provide a place to form the source/drain regions 46. With recesses having been generated, the source/drain regions 46 shown in FIG. 5 are epitaxially grown. As shown in FIG. 7, the source/drain regions 46 are disposed on opposing sides of the dummy gate oxide 40.

Figure 6:
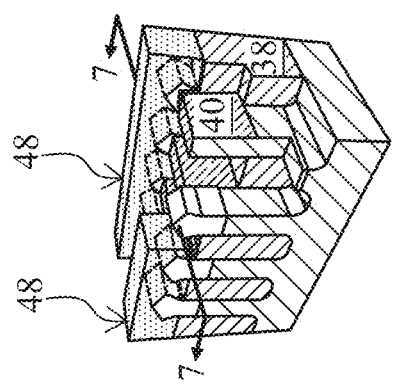

Next, as shown in FIG. 6, a dielectric 48 is formed over the source/drain regions 46 and the adjacent STI regions 38. In an embodiment, the dielectric 48 is an interlayer dielectric (ILD). In an embodiment, the dielectric 48 is formed using a flowable chemical vapor deposition (FCVD) process.

As shown in FIG. 7, spacers 50 are disposed on opposing sides of the dielectric 48. In an embodiment, the spacers 50 are formed after the polysilicon layer 42 has been formed. After the dielectric 48 has been formed, a CMP process is performed to smooth a top surface of the device.

Figure 8:
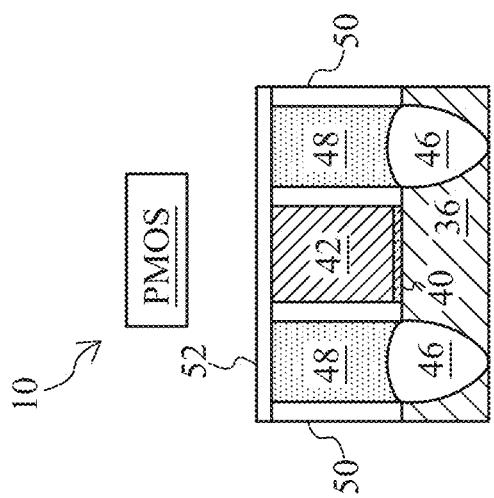

Next, referring collectively to FIGS. 6-8, a hard mask 52 is formed over both the embodiment n-type FinFET 20 (i.e., NMOS) and the neighboring p-type FinFET 10 (i.e., PMOS), which are depicted in an intermediate stage. Thereafter, a portion of the hard mask 52 is selectively removed from the n-type FinFET 20 using a photo mask. Next, the polysilicon layer 42 (see FIG. 5) disposed over the dummy gate oxide 40 and between two of the spacers 50 in the n-type FinFET 20 is removed as represented by the arrow in FIG. 7.

After the polysilicon layer 42 has been removed, an extra annealing process is performed. In an embodiment, the extra annealing process is performed at a temperature of between about 500° C. to about 650° C., for a time of between about 60 minutes to about 120 minutes, and/or at a pressure of about 1 atmosphere. In other embodiments, other temperatures, times, and pressures may be employed in order to achieve desired results.

In an embodiment, the annealing process causes elements such as, for example, nitrogen and hydrogen, to be off gassed from dielectric 48 as shown in FIG. 9. When the elements are off gassed, the dielectric 48 in FIG. 9 contracts or shrinks (as represented by the arrows in FIG. 9). In an embodiment, the annealing process shrinks the dielectric 48 between about 15% to about 18% relative to a size of the dielectric 48 prior to the annealing process. In an embodiment, the annealing process reduces a height and a width of the dielectric 48 as shown in FIG. 9 relative to the dielectric 48 in the p-type FinFET 10 in FIG. 10, which is not subjected to the extra annealing process.

The contraction or shrinking of the dielectric 48 bends or otherwise deforms the spacers 50 in the n-type FinFET 20 as shown in FIG. 9. Indeed, the spacers 50 in FIG. 9 are bent or curved inwardly relative to the straight or unbent spacers 50 in the p-type FinFET 10 in FIG. 10. In an embodiment, a contour of the contracted dielectric 48 is equivalent to a contour of the spacers 50 in FIG. 9. In an embodiment, the contracted dielectric 48 is generally vertically aligned with the source/drain regions 46.

Still referring to FIG. 9, the bending or deformation of the spacers 50 in the n-type FinFET 20 laterally expands the gate region 54 of the fin 36. Indeed, the spacers 50 are drawn inwardly toward the source/drain region 46 and each other by the shrinking dielectric 48, which provides additional surface area where a gate structure may be subsequently formed over the fin 36. In other words, an amount of deformation of the spacers 50 is due to the contracted dielectric 48 and contributes to a length of the enlarged gate region 54 in the fin 36. Notably, the enlarged gate region 54 allows for a longer channel in the n-type FinFET 20.

In an embodiment, a middle portion of each of the spacers 50 in FIG. 9 is deformed more than top and bottom portions of the spacers 50. In addition, in an embodiment the spacers 50 in FIG. 9 are laterally adjacent to the enlarged gate region 54 and the source/drain regions 46. Moreover, in an embodiment the spacers 50 in FIG. 9 are on opposing sides of the contracted dielectric 48.

After the extra annealing process has been performed and the spacers 50 of the n-type FET 20 bent or deformed as shown in FIG. 9, the dummy gate oxide 40 in FIG. 9 is removed and the gate electrode structure 56 of FIGS. 11, 13-14 is constructed. In an embodiment, the gate electrode structure 56 includes an interfacial oxide 58, a high-k value dielectric 60, and a metal gate 62.

After the gate electrode structure 56 has been formed in the n-type FinFET 20 as shown in FIG. 11, a CMP process is performed to smooth the top surface of the transistor. Thereafter, a hard mask 64 is formed over both the embodiment n-type FinFET 20 and the neighboring p-type FinFET 10 and then selectively removed from the p-type FinFET 10 using a photo mask as shown in FIGS. 11-12. Next, the polysilicon layer 42 disposed over the dummy gate oxide 40 and between two of the spacers 50 in the p-type FinFET 10 of FIG. 12 is removed.

Thereafter, the dummy gate oxide 40 in FIG. 12 is removed and the gate electrode structure 96 of FIG. 15 is generated. In an embodiment, the gate electrode structure 96 includes an interfacial oxide 98, a high-k value dielectric 90, and a metal gate 92 as shown in FIG. 15. After the gate electrode structure 96 has been formed in the p-type FinFET 10 as shown in FIG. 15, a CMP process is performed to smooth the top surface of the transistor. In an embodiment, the n-type FinFET 20 and the neighboring p-type FinFET 10 are disposed on the same silicon substrate 36 or wafer.

Referring to FIGS. 14-15, it should be recognized that the horizontal or lateral length of the gate region 54 in the n-type FinFET 20 is greater than the length of the gate region 94 in the p-type FinFET 10, which has not been stretched by shrinking dielectric 48 and inwardly drawn spacers 50. In addition, the height of the gate in the n-type FinFET 20 is less than the height of the gate in the p-type FinFET 10. In an embodiment, the dielectric 48 in the n-type FinFET 20 is formed from a different material than the dielectric 48 in the p-type FinFET 10.

Referring now to FIG. 16, a chart 66 illustrating how subjecting the dielectric 48 in the n-type FinFET 20 to the annealing process (i.e., the thermal process) affects gate length of the transistor.

Figure 19:
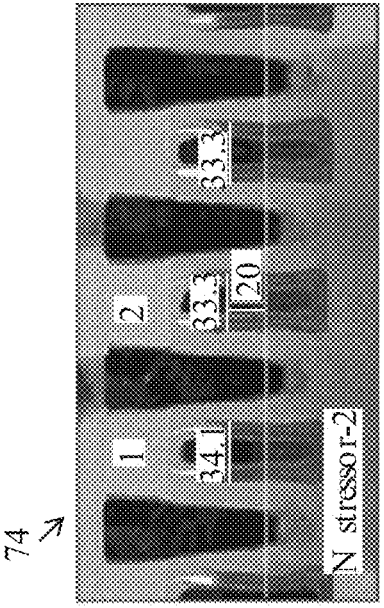
Figure 20:
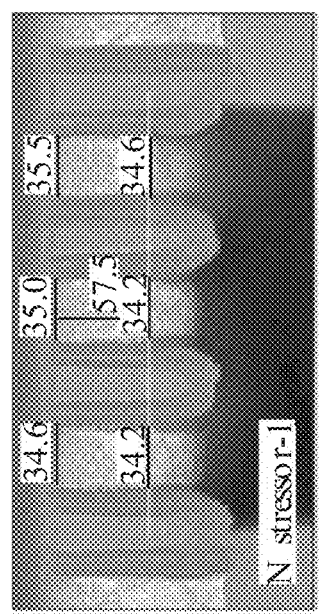

The n-type FinFETs 70, 74 in FIGS. 19-20 were subjected to an annealing process to shrink the dielectric and bend the spacers. The transistor in FIG. 19 was subjected to the extra annealing process at about 600° C. for a period of about 2 hours. The transistor in FIG. 20 was subjected to an annealing process at about 600° C. for a period of about 1 hour. Thereafter, the gate length of the transistors in FIGS. 19-20 was measured. The average gate length ($L_g$) in the transistor in FIG. 19 was measured as 34.3 nm and the average gate length of the transistor in FIG. 20 was measured as 33.6 nm.

Figure 17:
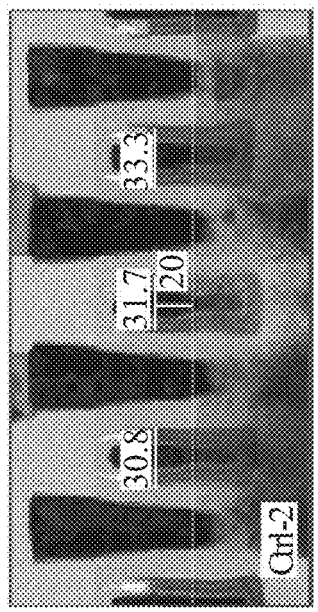
FIGS. 17-20 illustrate the transistors used to generate the data in the chart of FIG. 16.
Figure 18:
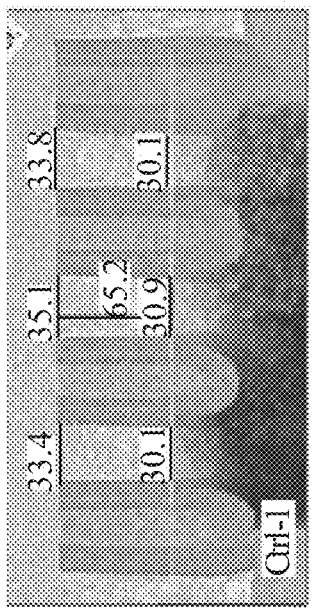

Unlike the transistors in FIGS. 19-20, the n-type FinFETs 68, 72 in FIGS. 17-18 were not subjected to the extra annealing process used to shrink the dielectric and bend the spacers. The average gate length ($L_g$) in the transistor in FIG. 17 was measured as 30.4 nm and the average gate length of the transistor in FIG. 18 was measured as 31.9 nm. Therefore, as shown in the chart 66 in FIG. 16, the average gate length in the transistor of FIG. 19 increased by about 3.9 nm relative to the average gate length in the transistor of FIG. 17. Likewise, the average gate length in the transistor of FIG. 20 increased by about 1.7 nm relative to the average gate length in the transistor of FIG. 18.

Figure 21:
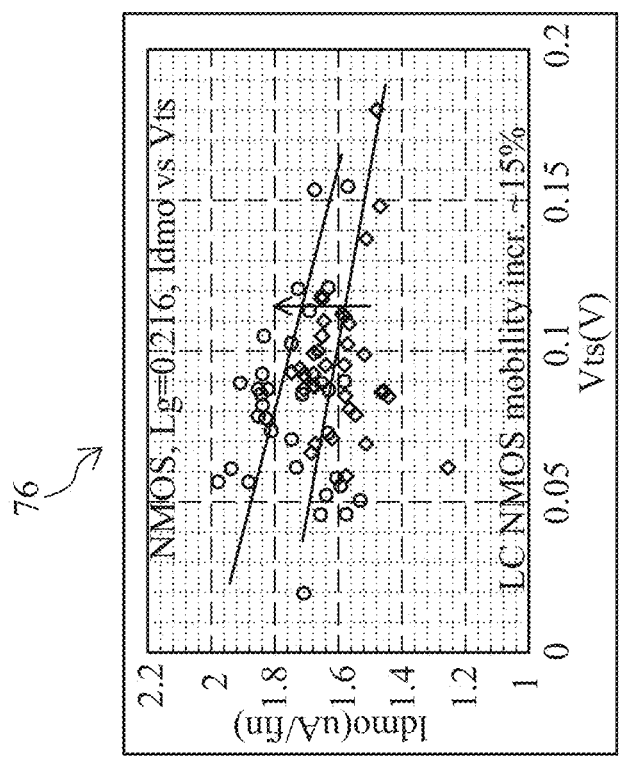
FIG. 21 illustrates the N-stressor split providing mobility increase for the n-type FinFET.

Referring now to FIG. 21, a chart 76 indicates that the N-stressor split showed mobility increase for the n-type FinFET 20. In FIG. 21, the circle data points correspond to the transistor with the extra annealing process described above while the diamond data points correspond to the transistor without the benefit of the extra annealing process. When the mobility index ($I_{dmo}$) is plotted relative to the voltage threshold ($V_{ts}$), the long channel (LC) NMOS mobility increased about 15%.

Figure 22:
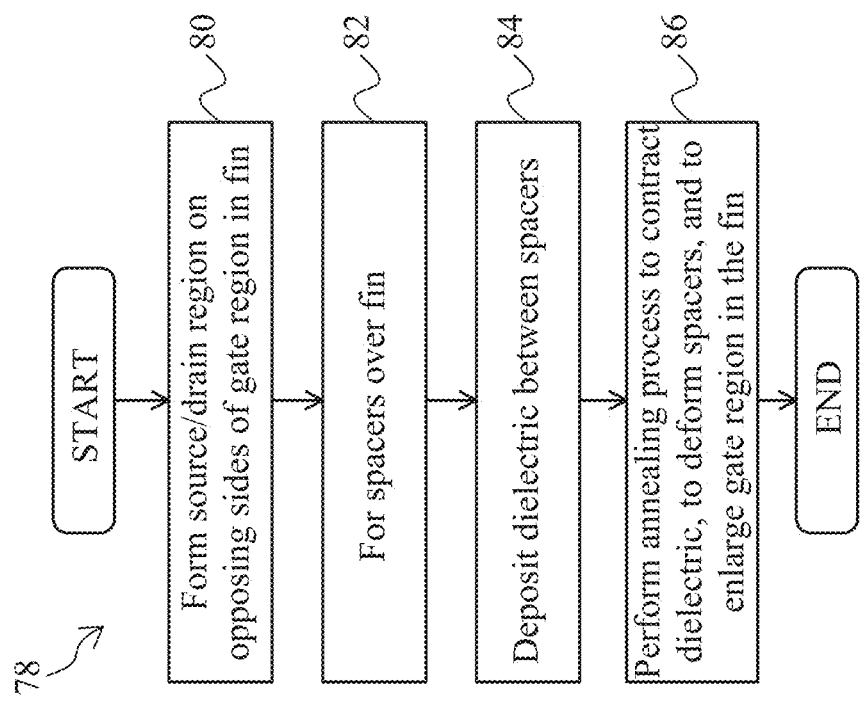
FIG. 22 illustrates an embodiment method of tuning tensile strain in an integrated circuit (e.g., the n-type FinFET of FIG. 2).

In FIG. 22, an embodiment method 78 of tuning tensile strain in an integrated circuit (e.g., the n-type FinFET 20) is illustrated. In block 80, a source/drain region is formed on opposing sides of a gate region in a fin. In block 82, spacers are formed over the fin. The spacers are generally adjacent to the source/drain regions. In block 84, a dielectric is deposited between the spacers. In block 86, an annealing process is performed to contract the dielectric. The dielectric contraction deforms the spacers, which causes the gate region in the fin to enlarge or expand.

An embodiment method of method of tuning tensile strain in an integrated circuit includes forming a source/drain region on opposing sides of a gate region in a fin, forming spacers over the fin, the spacers adjacent to the source/drain regions, depositing a dielectric between the spacers; and performing an annealing process to contract the dielectric, the dielectric contraction deforming the spacers, the spacer deformation enlarging the gate region in the fin.

An embodiment fin field effect transistor (FinFET) having a tunable tensile strain includes a source/drain region on opposing sides of an enlarged gate region in a fin, a contracted dielectric disposed over the source/drain regions, and spacers disposed over the fin, an amount of deformation of the spacers due to the contracted dielectric and contributing to a length of the enlarged gate region in the fin.

An embodiment integrated circuit having a tunable tensile strain includes a p-type metal-oxide-semiconductor (PMOS) device with a first gate region, and an n-type metal-oxide-semiconductor (NMOS) device adjacent the PMOS device, the NMOS device including deformed spacers on opposing sides of a contracted dielectric, the deformed spacers adjacent a second gate region, a length of the second gate region greater than a length of the first gate region.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A semiconductor structure comprising:
   a first device comprising:
      a first fin;
      first source/drain regions in the first fin;
      a first channel region interposed between the first source/drain regions; and
      a first gate electrode overlying the first channel region;
      a first dielectric layer on opposing sides of the first gate electrode, the first dielectric layer being a contracted dielectric, the first gate electrode having convex sidewalls projecting toward concave sidewalls of the first dielectric layer; and
      a dielectric spacer interposed between the first gate electrode and the first dielectric layer.

2. The semiconductor structure of claim 1, wherein the first device is a NMOS device.

3. The semiconductor structure of claim 1, wherein the dielectric spacer having a convex sidewall projecting toward the concave sidewall of the first dielectric layer.

4. The semiconductor structure of claim 1, further comprising a second device, the second device comprising:
   a second fin;
   a second gate electrode overlying the second fin; and
   a second dielectric layer adjacent the second gate electrode, wherein sidewalls of the second dielectric layer and the second gate electrode are linear.

5. The semiconductor structure of claim 4, wherein the second dielectric layer comprises a different material than the first dielectric layer.

6. The semiconductor structure of claim 5, wherein the second device is a PMOS device.

7. The semiconductor structure of claim 6, wherein a gate length of the first device is greater than a gate length of the second device.

8. The semiconductor structure of claim 4, wherein the first dielectric layer is denser than the second dielectric layer.

9. The semiconductor structure of claim 1, wherein a width of the first gate electrode is wider at a middle location than at a first location closer to the first fin and at a second location more distal from the first fin.

10. A semiconductor structure comprising:
    a semiconductor substrate;
    a first channel region in the semiconductor substrate;
    first source/drain regions in the semiconductor substrate on opposing sides of the first channel region;
    a first gate over the first channel region;
    a contracted dielectric disposed over the first source/drain regions; and
    first spacers interposed between the first gate and the contracted dielectric, the first spacers having a concave surface extending toward the contracted dielectric.

11. The semiconductor structure of claim 10, wherein the first gate comprises a metal gate electrode.

12. The semiconductor structure of claim 10, further comprising:
    a second channel region in the semiconductor substrate;
    second source/drain regions in the semiconductor substrate on opposing sides of the second channel region;
    a second gate overlying the second channel region; and
    a second dielectric layer adjacent the second gate, wherein sidewalls of the second gate and the second dielectric layer are linear.

13. The semiconductor structure of claim 12, wherein a height of the second gate is different than a height of the first gate.

14. The semiconductor structure of claim 13, wherein the first source/drain regions are n-type source/drain regions, wherein the second source/drain regions are p-type source/drain regions.

15. The semiconductor structure of claim 10, wherein the first gate has a lower width, a middle width, and an upper width, the lower width being closer to the semiconductor substrate than the middle width and the upper width, the middle width being closer to the semiconductor substrate than the upper width, the middle width being greater than the lower width and the upper width.

16. A semiconductor structure comprising:
    a first device comprising:
        a first fin;
        first source/drain regions in the first fin on opposing sides of a first channel region; and
        a first gate electrode overlying the first channel region;
    a first interlayer dielectric layer on opposing sides of the first gate electrode, the first interlayer dielectric layer being a contracted dielectric layer, the first gate electrode having convex sidewalls projecting toward concave sidewalls of the first interlayer dielectric layer;
    a second gate electrode; and
    a second interlayer dielectric layer on opposing sides of the second gate electrode, wherein the first interlayer dielectric layer is denser than the second interlayer dielectric layer.

17. The semiconductor structure of claim 16, further comprising first spacers interposed between the first gate electrode and the first interlayer dielectric layer.

18. The semiconductor structure of claim 16, wherein a height of the second gate electrode is less than a height of the first gate electrode.

19. The semiconductor structure of claim 16, wherein sidewalls of the second interlayer dielectric layer facing the second gate electrode are substantially linear.

20. The semiconductor structure of claim 16, wherein a widest width of the first gate electrode is in a middle region of the first gate electrode.

* * * * *